(12) United States Patent
Harris et al.

(10) Patent No.: US 9,196,767 B2
(45) Date of Patent: Nov. 24, 2015

(54) PREPARATION OF COPPER SELENIDE NANOPARTICLES

(71) Applicant: Nanoco Technologies Ltd., Manchester (GB)

(72) Inventors: James Harris, Manchester (GB); Nathalie Gresty, Chester (GB); Ombretta Masala, Manchester (GB); Nigel Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 14/333,316

(22) Filed: Jul. 16, 2014

(65) Prior Publication Data

US 2015/0024543 A1   Jan. 22, 2015

Related U.S. Application Data (60) Provisional application No. 61/847,639, filed on Jul. 18, 2013.

(51) Int. Cl.
| | | |
|---|---|---|
| *H01L 21/00* | (2006.01) | |
| *H01L 31/032* | (2006.01) | |
| *H01L 31/18* | (2006.01) | |
| *H01L 51/00* | (2006.01) | |
| *H01L 21/02* | (2006.01) | |

(52) U.S. Cl.
 CPC ........ *H01L 31/032* (2013.01); *H01L 21/02568* (2013.01); *H01L 21/02601* (2013.01); *H01L 21/02628* (2013.01); *H01L 31/0322* (2013.01); *H01L 31/1864* (2013.01); *H01L 51/0091* (2013.01)

(58) Field of Classification Search
 USPC .............................. 438/95; 977/773, 774, 896
 See application file for complete search history.

(56) References Cited

U.S. PATENT DOCUMENTS

| 6,258,620 | B1 * | 7/2001 | Morel et al. ..................... 438/57 |
| 8,784,701 | B2 * | 7/2014 | Pickett et al. ............ 252/519.14 |
| 2007/0092648 | A1 | 4/2007 | Duren et al. |
| 2007/0163640 | A1 | 7/2007 | Van Duren et al. |
| 2007/0163644 | A1 | 7/2007 | Van Duren et al. |
| 2007/0169809 | A1 | 7/2007 | Van Duren et al. |
| 2007/0169810 | A1 | 7/2007 | Van Duren et al. |
| 2007/0169811 | A1 | 7/2007 | Van Duren et al. |
| 2008/0213467 | A1 | 9/2008 | Yu et al. |
| 2008/0257201 | A1 | 10/2008 | Harris et al. |
| 2009/0139574 | A1 | 6/2009 | Pickett et al. |
| 2009/0280598 | A1 | 11/2009 | Curtis et al. |
| 2009/0280624 | A1 | 11/2009 | Curtis et al. |
| 2010/0003187 | A1 | 1/2010 | Guo et al. |
| 2011/0030786 | A1 | 2/2011 | Fujdala et al. |

FOREIGN PATENT DOCUMENTS

| EP | 2040305 | A2 | 3/2009 |
| EP | 2762444 | A1 | 8/2014 |
| WO | 2007101136 | A2 | 9/2007 |
| WO | 2008057119 | A1 | 5/2008 |
| WO | 2012075267 | A1 | 6/2012 |
| WO | 2013047461 | A1 | 4/2013 |

OTHER PUBLICATIONS

Deka et al., Phosphine-Free Synthesis of p-Type Copper(I) Selenide Nanocrystals in Hot Coordinating Solvents, J. Am. Chem. Soc. XXX, xxx, OOO, 10.102/ja103223x © XXX American Chemical Society, pp. A-C, Instituto Italiano di Technologia, Via Morego 30, 16163 Genova, Italy, and CNR—Istituto di Crystallografia (IC), Via Amendola 122/0, I-70126 Bari, Italy.

\* cited by examiner

*Primary Examiner* — Reema Patel
(74) *Attorney, Agent, or Firm* — Blank Rome LLP (57) ABSTRACT

A process for producing copper selenide nanoparticles by effecting conversion of a nanoparticle precursor composition comprising copper and selenide ions to the material of the copper selenide nanoparticles in the presence of a selenol compound. Copper selenide-containing films and CIGS semiconductor films produced using copper selenide as a fluxing agent are also disclosed.

19 Claims, 6 Drawing Sheets

PREPARATION OF COPPER SELENIDE NANOPARTICLES

FIELD OF THE INVENTION

The invention relates to materials useful for preparing photovoltaic semiconductor films, and more specifically, to methods of synthesizing copper indium gallium diselenide/sulphide nanoparticles.

BACKGROUND

To be commercially viable, photovoltaic cells must generate electricity at a price competitive with fossil fuels. Photovoltaic cells must therefore be fabricated inexpensively using low cost materials and exhibit moderate-to-high efficiency in the conversion of sunlight to electricity. Additionally, the methods used to synthesize the required materials and the device fabrication method must be scalable.

The high cost of crystalline silicon wafers (the industry standard photovoltaic absorber) has led industry to look at cheaper materials to make solar cells. Semiconductors having the formula $CuInSe_2$ or $Cu(In,Ga)Se_2$ (a.k.a. CIGS) materials are strong light absorbers, with absorption coefficients on the order of $10^5$ $cm^{-1}$. Consequently, the active layer in a solar cell incorporating CIGS materials can be as small as a few microns thick. Thicker layers are required in silicon-based solar cells because silicon is a relatively poor absorber of light. Moreover, the single crystal silicon wafers currently used are expensive to produce because the process involves fabricating and then accurately slicing high-purity, single-crystal silicon ingots.

Recent effort has focused on producing high efficiency solar cells incorporating a thin film of CIGS semiconductor material. Binary chalcogenide nano-powders including copper selenide, indium selenide, and gallium selenide have been proposed as starting materials for CIGS material. The band gaps of $CuInS_2$ (1.5 eV) and $CuInSe_2$ (1.1 eV) are well matched to the solar spectrum, predisposing them to high conversion efficiency. By 2010, thin-film solar cell efficiencies of up to 20.3% had been achieved for $Cu(In,Ga)Se_2$ materials by researchers at the Centre for Solar Energy and Hydrogen Research in Germany (ZSW).

Absorber layers for CIGS photovoltaic devices can be fabricated using a variety of methods, which generally involve expensive vapour phase or evaporation techniques. Alternatively, nanoparticles can be printed and then melted or fused together to form a thin film, such that the nanoparticles coalesce to form large grains. One such method utilises metal oxide nanoparticles, which are then reduced using $H_2$, after which the resulting film is selenised, usually with $H_2Se$. The costly selenisation step and the use of toxic $H_2Se$ can be avoided by incorporating a selenium source into the nanoparticles.

There are a number of techniques currently used to prepare copper selenide nanoparticles. Nanoparticles can be produced using colloidal methods, solvothermal methods, sonochemical methods, surfactant-assisted methods and ball milling of bulk copper selenide produced using a solid state synthetic method. Microbially-mediated routes to the synthesis of CuSe nanoparticles have also been proposed.

Colloidal methods typically involve high temperature (>250° C.) syntheses, such as hot injection, to form nanoparticles capped with trioctylphosphine oxide (TOPO) or amines. Hot injection relies on the injection of small volumes of precursors into a large volume of solvent at elevated temperature. The high temperature breaks down the precursors, initiating nucleation of the nanoparticles. For example, $Cu_2Se$ nanoparticles have been made by hot injection of TOP/Cu and TOP/Se into a solution of TOPO and octylphosphonic acid, after which the temperature of the reaction mixture is lowered to support nanoparticle growth over a particular period of time before quenching with a suitable organic solvent.

Solvothermal methods have been studied for the synthesis of copper selenide nanoparticles. However, particle size distribution and solubility are usually very poor. In a typical solvothermal synthesis, copper selenide is formed from the reaction of a copper salt with elemental selenium in an autoclave filled with a gas, such as ammonia.

Sonochemical synthesis typically involves ultrasonic irradiation of a copper salt with a selenium source in the presence of an organic solvent and/or water. The resulting nanoparticles are typically on the order of tens of nanometers to 1 µm in diameter.

Surfactant-assisted pathways for nanoparticle synthesis have been explored for their high reaction yields, shape-controlled nanoparticle formation, and economic and environmental advantages of synthesis in water. Copper selenide nanoparticles have been synthesised via a reaction between copper acetate and sodium selenite in the presence of aqueous hydrazine and an aqueous cationic Gemini surfactant (a surfactant incorporating two surfactant moieties linked by a spacer).

Bulk copper selenide can be formed by solid-state reactions and then milled into nanoparticles. For example, $Cu_3Se_2$ can be formed by contacting $\alpha$-CuSe with $\alpha$-$Cu_2Se$ at high pressure over an extended period of time. $\alpha$-CuSe can be prepared by heating copper with selenium and $\alpha$-$Cu_2Se$ prepared in a similar manner but by heating to a higher temperature.

Microbially-mediated routes to the synthesis of CuSe nanoparticles have been proposed which employ a source of copper ions and a selenium source in a bacterial culture that can reduce Se to $Se^{2-}$. Nanoparticle size is typically controlled by the reaction time, which can range from minutes at elevated temperatures to three weeks at lower temperatures. The reaction time to achieve a particular result is influenced by the type of bacteria used, which in turn influences the pH at which the reaction must be carried out. There are therefore a number of factors which must be taken into account when seeking to use such methods to produce high quality copper selenide nanoparticles of a particular size.

To ensure a competitive cost for the manufacture of photovoltaic devices using copper selenide nanoparticles, device fabrication should be relatively cheap. Such techniques include, for example, printing or spraying processes. Existing methods for synthesising copper selenide nanoparticles, as described above, are unfavourable for processing into thin films on a commercial scale as they do not encompass the desirable features of a scalable reaction to generate the required type of nanoparticles having a low melting point, narrow size distribution and a volatile capping ligand. For instance, hot injection techniques produce materials in very low yields and are not easily scaled commercially. Other techniques, such as solvothermal or sonochemical syntheses, do not allow tight control over the physical properties of the nanomaterials. Solid-state reactions form bulk material, which must subsequently be subjected to high-energy ball milling at high temperatures to be broken down into nanoparticles.

Furthermore, current methods for fabricating solar cells are based on traditional vacuum-based deposition processes that require high temperatures and long reaction times to sinter the absorber materials. These methods have several drawbacks, including the need to use expensive equipment to generate the high-vacuum required and substrates that can withstand high temperatures. Further disadvantages are the limited availability of high purity reagents, the reliance upon deposition approaches that are limited to line-of-sight and limited-area sources, which tend to result in poor surface coverage, and, in the case of absorber materials made from more than one element, poor elemental ratio control.

Solar cells that can be printed on flexible substrates represent an attractive, cost-efficient alternative to conventional, vacuum-deposited solar cells because the materials can be deposited using non-vacuum, solution-processable printing technologies. To meet the growing demand for low-cost solar cells employing flexible substrates, there is a need for a simple, low-temperature technique for fabricating high-quality, homogeneous copper selenide nanoparticles that can be dispersed readily into aqueous or organic media to provide economically viable methods for fabricating copper selenide-based devices using solution-processable nanoparticle deposition techniques.

SUMMARY

Described herein are methods for producing copper selenide nanoparticles by converting a nanoparticle precursor composition containing copper and selenide ions to the material of the copper selenide nanoparticles in the presence of a selenol compound. The method allows control of the copper to selenium stoichiometry and crystallographic phase, yielding essentially monodisperse copper selenide nanoparticles. The resulting nanoparticles have uniform size, and thus, a narrow melting point range. The nanoparticles are capped with an organic ligand to confer solubility and/or dispersibility in organic media, providing processable ink formulations, which can be used to fabricate printable solar cells on flexible substrates. In particular embodiments, the capping ligands can be removed easily at relatively low temperature, thereby enabling low temperature device sintering. Additionally, since in some embodiments the capping ligand can be almost entirely removed under relatively mild heating, the sintered nanoparticles include essentially no carbon residue enabling the fabrication of high performance devices.

The selenium-rich nanoparticle capping ligand contributes to a selenium-rich atmosphere during sintering, thus avoiding the need for a subsequent selenisation step. Growing the copper selenide nanoparticles this way allows excellent control of the elemental ratio of the sintered copper selenide nanoparticle material. Moreover, the method is scalable to produce large, commercially relevant (e.g. kilogram) quantities of copper selenide nanoparticle material.

The disclosure also provides a process for producing a printable ink formulation comprising copper selenide nanoparticles by combining copper selenide nanoparticles with a suitable ink base. Thus, the disclosure provides a printable ink formulation comprising copper selenide nanoparticles and a suitable ink base. According to certain embodiments, the printable ink formulation comprises up to around 50% w/v of copper selenide nanoparticles.

The disclosure provides a process for fabricating a thin film comprising copper selenide nanoparticles by depositing a layer of copper selenide nanoparticles and, optionally a source of gallium and/or indium ions onto a supporting layer and subsequently annealing said deposited layer under a static atmosphere. The static atmosphere may be a substantially inert atmosphere, or may contain active components, such as selenium. The supporting layer may be any material(s) generally located adjacent to a CIGS layer in a photovoltaic device. In one embodiment, the supporting layer comprises molybdenum. A further layer of any suitable material may be provided on the CIGS layer. By way of example, the further layer may comprise an n-type material, such as, but not limited to, cadmium sulphide.

A further embodiment provides a process for depositing copper selenide nanoparticles in combination with CIGS nanoparticles to form a layer on a supporting layer and subsequently annealing the deposited layer to form a CIGS absorber layer, the copper selenide nanoparticles acting as a sintering flux to promote the formation of large grains.

The photovoltaic device layer may comprise a thin film produced as referenced above. Thus, the disclosure provides a photovoltaic device incorporating such a layer.

DISCLOSURE

Nanoparticles of copper selenide can be used as a source of copper and selenium in the fabrication of thin films for solar cells based on semiconductors having the formula $CuInSe_2$ or $Cu(In,Ga)Se_2$, or more generically, $CuIn_{1-a}Ga_aSe_{2-b}S_b$ where a is greater than or equal to 0 and less than or equal to 1 and b is greater than or equal to 0 and less than 2 (CIGS). Copper selenide nanoparticles can also be used as an additive or 'sintering flux' that lowers the temperature required for grain growth and densification of the $CuInSe_2$ or $Cu(In,Ga)Se_2$ material of the solar cell. A good sintering flux is present as a liquid phase during the sintering process and should completely wet the solid particles to be sintered. Nanoparticles of copper selenide have a lower melting point than the bulk material and therefore can be a better candidate as a sintering flux because the CIGS material can be densified at lower temperatures, allowing fabrication of low temperature sintering devices.

For copper selenide nanoparticles to feature as a starting material for photovoltaic thin films, they should possess or exhibit a number of properties. Primarily, the nanoparticles must be small. Smaller particles are able to pack closely together, enabling them to coalesce upon melting. Secondly, a narrow size distribution is favoured to ensure that all of the nanoparticles melt at approximately the same temperature, thereby ensuring that the resulting thin film is homogeneous and of a high quality. Thirdly, it is preferred that the nanoparticles are capped with a volatile organic capping ligand to help to solubilise the nanoparticles in organic solution, but which must also be easily removed upon heating to avoid the detrimental incorporation of carbon into the final thin film. Finally, the melting temperature of the nanoparticles should be lower than the bulk material, allowing the use of lower processing temperatures.

Any desirable selenol compound may be employed for the method of making selenide nanoparticles, as described herein. Preferably the selenol compound is an organoselenol compound, which is most preferably a volatile organoselenol compound. Reference to an organic compound as being 'volatile' is well understood in the relevant technical field by the skilled person and generally refers to a compound that will vaporise at temperatures and/or pressures that are relatively low compared to other species with which the volatile compound is associated. In this way, using a volatile organoselenol compound provides the advantage of allowing the selenol to be easily and cheaply removed from the nanoparticles, for example by heating.

The organoselenol compound may be represented by the formula R—SeH, where R is a substituted or unsubstituted organic group. A substituted organic group is one in which one or more non-hydrogen atoms are bonded to a carbon atom in place of a hydrogen atom in the unsubstituted version of the organic group. The organic group can be saturated or may include any appropriate level of unsaturation. Said organic group is preferably a linear, branched or cyclic organic group, which may be a carbocylic group or a heterocyclic group. The organic group is preferably selected from the group consisting of alkyl, alkenyl, alkynyl and aryl. The organic group may be an alkyl, alkenyl or alkynyl group containing 2 to 20 carbon atoms, more preferably 4 to 14 carbon atoms and most preferably 6 to 10 carbon atoms. It is particularly preferred that the selenol compound is 1-octane selenol (as used in the Examples below). A further preferred selenol compound is 1-dodecane selenol or 1-dodecylselenol. Although 1-dodecane selenol is less volatile than 1-octane selenol, both compounds are sufficiently volatile to be used. Alternatively, the organic group may be an aryl group containing 4 to 14 carbon atoms. More preferably the organic group is an aryl group containing 6 to 10 carbon atoms, still more preferably 6 to 8 carbon atoms.

The process to form copper selenide nanoparticles can comprise dispersing at least a first portion of the nanoparticle precursor composition in a solvent. The first portion of the nanoparticle precursor composition may comprise a source of copper ions. The conversion of the precursor composition to the material of the nanoparticles may be conducted in any appropriate solvent. Preferably the solvent is a high boiling point solvent (e.g. around 200° C. or higher) and is most preferably a non-coordinating solvent. It is preferred that the solvent is an organic solvent, for example a saturated or unsaturated long-chain hydrocarbon solvent. Preferred solvents include long chain, e.g. C8-C24, alkanes or alkenes, such as 1-octadecene, $(C_{18}H_{36})$ which has a boiling point in excess of 250° C.

The solvent may be heated to a first temperature after addition of the first portion of the nanoparticle precursor composition. The first temperature may be around 70 to 170° C., more preferably around 90 to 150° C. and still more preferably around 100 to 140° C. Most preferably the first temperature is around 140° C. Said heating may be applied for any appropriate length of time, preferably around 10 to 40 minutes, more preferably around 20 to 30 minutes.

Preferably the selenol compound is added to the solvent containing the first portion of the nanoparticle precursor composition. Following addition of the selenol compound, the solvent may be heated to a temperature of around 100 to 200° C., more preferably around 120 to 160° C. and most preferably around 160° C. Said heating can be applied for any desirable time period. By way of example, heating may be applied for up to around 30 minutes.

Following heating of the reaction mixture containing the first portion of the nanoparticle precursor composition and the selenol compound dispersed in the solvent, optionally a second portion of the nanoparticle precursor composition may be added to the reaction mixture. The second portion of the nanoparticle precursor composition preferably comprises a source of selenide ions. It is preferred that the second portion of the nanoparticle precursor composition is added relatively slowly, for example dropwise, to ensure nanoparticle growth proceeds in a controlled manner.

It is preferred that the solvent containing the nanoparticle precursor composition and the selenol compound is heated to a second temperature during and/or after addition of the second portion of the nanoparticle precursor composition. Preferably the second temperature is higher than the first temperature. By way of example, the second temperature is preferably around 120 to 220° C., more preferably around 140 to 200° C., still more preferably around 150° C. to 170° C. It is particularly preferred that the second temperature is around 160° C. Said heating to the second temperature may be applied for any appropriate time. It has been found that heating to the second temperature over a period of up to around 10 hours may be suitable. Once the solvent has been heated to the second temperature it is preferred that the solvent be maintained at approximately that temperature for a period of time required to provide nanoparticles possessing the desired properties. Suitable time periods in this regard may be up to around 10 hours or longer, more preferably around 0.5 to 6 hours, and most preferably around 1 to 2 hours. The solvent containing the nanoparticle precursor composition may then be cooled to a third, lower temperature of, for example 100 to 140° C., more preferably around 120° C., to allow the copper selenide nanoparticles to anneal. The solvent may be maintained at the third temperature for any suitable time period to ensure the nanoparticles have annealed, such as around 1 to 10 hours, more preferably around 2 to 6 hours and most preferably around 4 hours.

Preferably the copper ions are provided in the nanoparticle precursor composition by a copper coordination compound, such as an acetate or acetylacetonate, for example copper acetate or copper acetylacetonate, as used below in some of the Examples.

In the nanoparticle precursor composition, at least a portion of the selenide ions may be provided by a selenol compound. Alternatively or additionally, at least a portion of the selenide ions in the nanoparticle precursor composition may be provided by elemental selenium and/or a selenium-containing compound, such as, but not limited to trioctylphosphine selenide (TOP/Se) or selenium in 1-octadecene solution (Se/ODE).

In an embodiment of the process, the first portion of the nanoparticle precursor composition (the copper ion source in this embodiment) is initially combined with a suitable organic solvent, such as 1-octadecane (ODE). The second portion of the nanoparticle precursor composition (the selenide ion source in this embodiment) is then added to the copper ion source and the resulting mixture heated in the presence of a selenol, such as 1-octane selenol, to encourage growth of copper selenide nanoparticles. After heating, the mixture is then cooled so that the copper selenide nanoparticles anneal and form a stable dispersion of selenol-capped copper selenide nanoparticles. Nanoparticles thus formed are eminently suitable to be formulated into printable inks for use in the fabrication of printed solar cells or for use in a range of other applications.

The selenide ion source for the copper selenide nanoparticles may be a selenol, which can also function as the capping ligand. Alternatively, a different selenium source, such as elemental selenium, may be included in addition to the selenol. By way of further elaboration, Examples 1, 2, 4 and 5 below employ 1-octane selenol and a separate selenide ion source in the form of either TOP/Se, Se/ODE or elemental selenium. In contrast, Example 3 employs only 1-octane selenol, which acts as both the selenide ion source and the selenol capping ligand.

The nanoparticles can be represented by formula (I): $Cu_{(2-x)}Se$, where $0 \leq x < 2$. The nanoparticles can be capped with a selenol capping ligand. The selenium atom of the selenol may be incorporated into the nanoparticle. Thus, according to some embodiments, the capping ligand becomes associated with the surface of the nanoparticle via a carbon—selenium bond between a carbon in the capping ligand and the selenol selenium atom that becomes a part of the nanoparticle surface.

The disclosed method enables high quality, monodisperse copper selenide nanoparticles of specific, predetermined stoichiometry to be produced in high yield. Nanoparticles may be prepared having the formula CuSe, $Cu_2Se$ or any other formula having a stoichiometry in between CuSe and $Cu_2Se$, for example, $Cu_{1.74}Se$ (as in Example 1) or $CuSe_{0.96}$ (as in Example 5).

The process may be used to produce copper selenide nanoparticles of any desirable form, e.g. size, shape, number of phases etc. Moreover, it will be appreciated that the nanoparticles can be subjected to any desirable number of further processing steps.

Once the nanoparticles are formed, the surface atoms of the nanoparticles are coordinated with a selenol capping ligand employed in the nanoparticle growth process. In embodiments in which a volatile selenol compound is employed, the selenol capping ligand can be removed conveniently by heating, such as occurs during fabrication of a device layer incorporating the selenol-capped nanoparticles. Removing the selenol capping ligand minimises carbon residues in the final device layer, which might otherwise damage the efficiency of the device incorporating the layer. Moreover, removal of the volatile selenol compound can yield 'naked' nanoparticles to which further coordinating ligand, e.g. a Lewis base, can be added to bestow the resulting nanoparticles with any desirable property. By way of example, a further capping ligand can be added to modify the solubility of the nanoparticles and/or modify the ability of the nanoparticles to bind to other species.

As mentioned above, the disclosure provides a process for producing a printable ink formulation by producing nanoparticles as described herein and combining said nanoparticles with a suitable ink base. The ink base preferably comprises one or more organic compounds selected from the group consisting of an aromatic compound, an aliphatic compound and a selenol compound. In preferred embodiments, said ink base comprises toluene and/or 1-dodecane selenol.

It is preferred that a sufficient quantity of said nanoparticles are combined with said ink base such that the resulting ink formulation comprises up to around 50% w/v of said nanoparticles, more preferably around 10 to 40% w/v of said nanoparticles, and most preferably around 20 to 30% w/v of said nanoparticles. The ink base can include one or more organic compounds, which may be selected from the group consisting of an aromatic compound, an aliphatic compound and a selenol compound. In a preferred embodiment said ink base comprises toluene, 1-dodecane selenol, or a combination thereof. The ink formulation may comprise around 10 to 40% w/v of said nanoparticles or, more preferably, around 20 to 30% w/v of said nanoparticles.

As set out above, the disclosure provides a process for fabricating a thin film comprising nanoparticles incorporating ions of copper, selenium, and gallium and/or indium by depositing a layer of said copper selenide nanoparticles and a source of gallium and/or indium ions on to a supporting layer and subsequently annealing said deposited layer under a static atmosphere. In a further embodiment, a process for fabricating a thin film comprising nanoparticles incorporating ions of copper, selenium, and gallium and/or indium is provided. The process involves depositing a layer of said copper selenide nanoparticles and CIGS nanoparticles on to a supporting layer and subsequently annealing said deposited layer under a static atmosphere. The copper selenide nanoparticles act as a sintering flux to promote the growth of large crystal grains in the CIGS thin film. The preparation of CIGS nanoparticles is described in the applicant's co-pending US Patent Application no. 2009/0139574: "Preparation of Nanoparticle Material," which is hereby incorporated by reference in its entirety. Moreover, as set out above, the disclosure provides a process for fabricating a thin film comprising copper selenide nanoparticles by producing copper selenide nanoparticles, depositing a layer of said copper selenide nanoparticles on to a supporting layer and subsequently annealing said deposited layer under a static atmosphere.

Deposition of the layer may be achieved by printing, coating or spraying the ink onto the supporting layer under conditions permitting formation of said thin film on said supporting layer. Deposition may be achieved using any appropriate method, such as drop casting and/or spin coating. Where spin coating is applied, said spin coating may be effected using a spinning speed of up to around 5000 rpm, more preferably a spinning speed of around 500 to 3500 rpm, and most preferably a spinning speed of around 2000 rpm. Alternatively or additionally, said spin coating may be effected over a time period of up to around 300 seconds, more preferably a time period of around 20 to 150 seconds, and most preferably a time period of around 60 seconds.

Formation of said thin film preferably comprises at least one annealing cycle, the or each annealing cycle comprising a series of steps in which the temperature of the nanoparticle-containing layer deposited on the supporting layer is repeatedly increased and subsequently maintained at said increased temperature for a period of time, following which the nanoparticle-containing layer is cooled to form the nanoparticle-containing thin film.

The highest temperature to which the nanoparticle-containing layer is heated during said at least one annealing process may be below the vaporisation temperature of selenium at the pressure at which heating is being effected and/or less than or equal to around 450° C., more preferably less than or equal to around 410° C. to ensure that loses of selenide ions from the nanoparticle-containing layer are at least minimized or, more preferably substantially avoided. At least one annealing cycle may be effected at a sufficiently high temperature to remove some or substantially all of the selenol-based capping ligand from the nanoparticles.

Preferably each of said series of steps is effected to provide an increase in temperature of the nanoparticle-containing layer of around 10 to 70° C. Initial steps may be effected to provide larger temperature increases than later steps. By way of example, a first of such steps may effect a temperature increase of around 50 to 70° C., followed by one or more subsequent steps in which the temperature is increased by around 10 to 20° C.

Each of said series of steps preferably comprises increasing the temperature of the nanoparticle-containing layer at a rate of up to around 10° C./minute, more preferably at a rate of around 0.5 to 5° C./minute and most preferably at a rate of around 1 to 2° C./minute. In a preferred example, initial steps may involve temperature increases at a greater rate than later steps. For example, in a preferred embodiment, one or two of the initial steps may comprise heating to provide temperature increases of around 8 to 10° C./minute, while later steps may involve temperature increases of around 1 to 2° C./minute.

As mentioned above, each step involves heating and then maintaining the nanoparticle-containing layer at said increased temperature for a predetermined period of time. Said predetermined time period may be up to around 60 minutes, more preferably said predetermined time period is around 5 to 40 minutes, and most preferably is around 10 to 20 minutes.

In a preferred embodiment the or at least one of the annealing cycles is effected under a static atmosphere, a substantially inert atmosphere and/or an atmosphere containing selenium.

In a particularly preferred process formation of said nanoparticle-containing thin film comprises first and second annealing cycles, the first annealing cycle increasing the temperature of the nanoparticle-containing layer to a first maximum temperature and the second annealing cycle increasing the temperature of the nanoparticle-containing layer to a second maximum temperature, said second maximum temperature being higher than said first maximum temperature. It is preferred that the second maximum temperature is less than or equal to around 450° C. and/or that the first maximum temperature is less than or equal to around 300° C. The second annealing cycle is preferably carried out in a static atmosphere.

The CIGS thin film formed on a supporting layer, as described above, may be incorporated into a photovoltaic device. In some embodiments, the supporting layer is a molybdenum substrate. Subsequent layers may be deposited on top of the CIGS layer to form the photovoltaic device. In some embodiments, a cadmium sulphide layer is deposited on top of the CIGS layer to form a p-n junction. Methods to form a photovoltaic device comprising a CIGS absorber layer are described in the applicant's U.S. Pat. No. 8,563,348, entitled "Fabrication of Electrically Active Thin Films based on Multiple Layers," which is hereby incorporated by reference in its entirety.

The stoichiometry of CIGS thin films impacts their electrical properties because the composition largely determines the concentration of donor and acceptor sites. Higher copper content is often desired to promote the formation of larger grains in, for example, $CuInSe_2$ thin films, which are the base for achieving higher efficiencies in solar cells. By changing the reaction conditions, the stoichiometry of the resulting copper selenide nanoparticles to be tuned from 2:1 ($Cu_2Se$) to 1:1 (CuSe), and all materials in between these extremes, enabling printable ink formulations of any stoichiometry to be prepared that can subsequently be used to fabricate CIGS thin films of any desired stoichiometry. It will be appreciated that $Cu_2Se$ and CuSe have significantly different properties even though the method provides a relatively simple and convenient means for preparing either material. For example, the melting point of CuSe is significantly lower than $Cu_2Se$. Thus, CuSe is often added as a liquid flux to assist the intermixing of the precursors and promote grain growth during sintering of CIGS thin films, e.g. $CuInSe_2$.

The small particle size of the copper selenide nanoparticles that can be achieved lowers the melting point of the resulting nanoparticles with respect to the bulk material, thus enabling the annealing step(s) during device fabrication to be carried out at lower temperatures, which are more economically favourable.

Another advantage of the disclosed method is the ability to produce monodisperse copper selenide nanoparticles of any desirable size. The nanoparticles within monodisperse populations typically exhibit similar properties such as melting points. Thus, the ability to produce monodisperse populations is advantageous because films formed from such populations have a narrow and uniform melting range. According some embodiments, the standard deviation in the diameters of the nanoparticles are less than about 25%, preferably less than about 15%, more preferably less than about 10%, and most preferably less than about 5% of the average diameter of the nanoparticles in the population.

Many optical and electronic properties of nanocrystal assemblies are determined by the orientational ordering of the nanoparticles in the superlattices they form on a solid substrate. The native morphology of the nanoparticles has a strong influence on the packing pattern of the nanoparticles and so the synthesis of monodisperse nanoparticles enables the nanoparticles to be sintered into close-packed films, which easily form superlattices on solid substrates upon evaporation of the solvent.

Another advantage of this method is that the resulting copper selenide nanoparticles can be dispersed or dissolved in a range of solvents. The ink or paste formulation can be deposited using printing techniques such as spin coating, slit coating and doctor blading. It is envisaged that printable solar-cells may ultimately replace existing methods of manufacturing solar cells which currently require high temperatures and are relatively expensive.

An advantage of embodiments of the method is that the resulting nanoparticles are capped with a volatile organoselenol ligand, which coordinates effectively to the nanoparticles, thereby controlling their growth in the reaction solution and providing a selenium-rich atmosphere during sintering. In this way, the presence of a selenium-rich ligand prevents the loss of selenium from the copper selenide nanoparticles and enables control of the elemental ratio of copper and selenide ions in the final copper selenide film since the elemental ratio of copper to selenide is unaltered during the low-temperature sintering step required to process the nanoparticles into the film. As mentioned previously, this avoids the need for a further selenisation step, which is often required to compensate for the loss of selenium during the sintering process employed in traditional methods for fabricating metal selenide films. Another advantage is that the selenium-rich ligand avoids contamination of the copper selenide nanoparticles with ligands containing chalcogenides other than selenium, such as sulphur. For example, alkanethiols are suitable ligands for the preparation of metal selenide nanoparticles, however, the resulting nanoparticles suffer from a lower selenium content that may be attributed to the capping alkanethiol existing on the particle surface and replacing the selenium.

Another advantage of embodiments of the method is that the organoselenol ligand that caps the nanoparticles can be chosen such that it can be removed at sufficiently low temperatures to facilitate convenient device processing. Sintering is an important stage of the device fabrication and the prospect of low temperature sintering can significantly reduce the manufacturing costs. Another benefit is that, after sintering, no significant carbon residue is observed in the sintered film, which might otherwise damage the efficiency of the device incorporating the film.

Another advantage is the simplicity of the reaction equipment and the mild reaction conditions that can be used. In some embodiments, temperatures below 200° C. are sufficient to obtain particles with good crystallinity; conditions that are compatible with many temperature-sensitive substrates and foils often used in typical 'roll-to-roll' processing methods.

Additionally, the material utilization efficiency is maximized and may be close to 100%. The precursors, except the ligand, are commercially available and relatively safe to handle. It will be appreciated that these properties are highly desirable when developing a commercially scalable method for large-scale production of copper selenide nanoparticles. The method enables large quantities (e.g. kilogram amounts) of monodisperse copper selenide nanoparticles, eminently suitable for processing into high quality copper selenide thin films, to be produced at relatively low cost, which represents an attractive alternative to existing methods, such as vacuum-based deposition techniques.

EXAMPLES

Examples below describe methods for producing copper selenide nanoparticles with tunable properties and characterizing films made thereof.

Example 1

Figure 1:
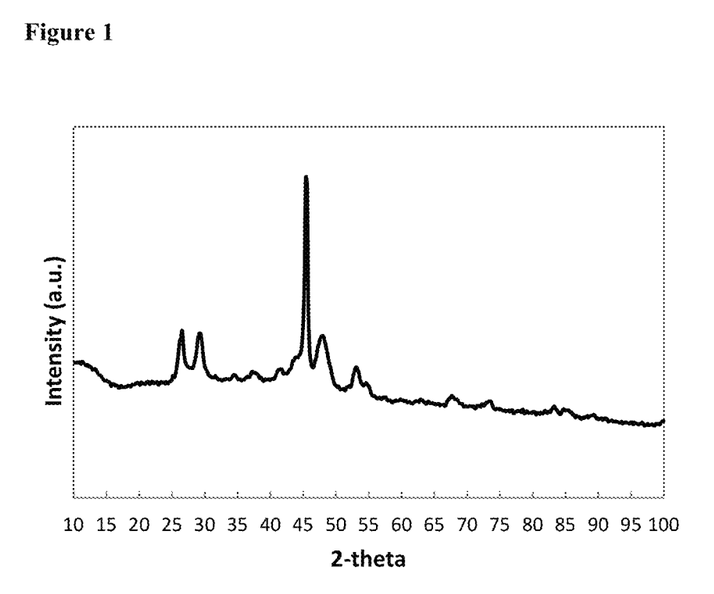
FIG. 1 is an X-ray diffraction (XRD) pattern for hexagonal phase $Cu_{2-x}Se$ capped with 1-octane selenol, as synthesised in Example 1.
Figure 2:
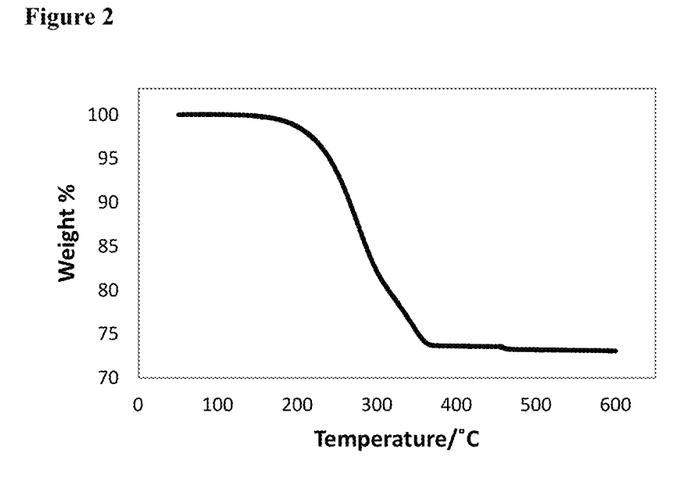
FIG. 2 is a thermogravimetric analysis (TGA) plot for hexagonal phase $Cu_{2-x}Se$, as synthesised in Example 1, showing an inorganic content of 73% for organic-capped nanoparticles.

Synthesis of Hexagonal Phase Octane Selenol-Capped $Cu_{2-x}Se$ Nanoparticles 1.58 g of Cu(ac) (ac=acetate; 0.129 mol) and 12 mL of 1-octadecene were degassed for 30 minutes at 100° C., then 10 minutes at 140° C., before cooling to room temperature under nitrogen flow. The cooled mixture formed a dark green solid. 8 mL of 1-octane selenol (0.0448 mol) was injected into the flask, then the mixture was heated to dissolve the solid and distil off the acetic acid; the flask temperature was raised to 160° C. to completely dissolve the solid. After cooling to 140° C., 8 mL of TOP/Se (1.71 M, 0.0137 mol) was injected into the flask, dropwise, over 8 minutes. Once the addition was complete, the temperature was raised to 160° C. for 2 hours, before annealing at 120° C. for 4 hours, then cooling to room temperature. The solid was isolated by washing with methanol, then acetone, followed by centrifugation. The yellow/brown supernatant was discarded, and the dark brown solid was retained as the product. Elemental analysis by inductively coupled plasma optical emission spectroscopy (ICP-OES): C 17.38%; H 2.95%; Cu 46.04%; Se 32.82%. The elemental ratio corresponds to a material with formula $Cu_{1.74}Se$. FIG. 1 is an X-ray diffraction (XRD) pattern for hexagonal phase $Cu_{2-x}Se$ capped with 1-octane selenol, according to Example 1. FIG. 2 is a thermogravimetric analysis (TGA) plot for hexagonal phase $Cu_{2-x}Se$, as synthesised in Example 1, showing an inorganic content of 73% for organic-capped nanoparticles.

Example 2

Figure 3:
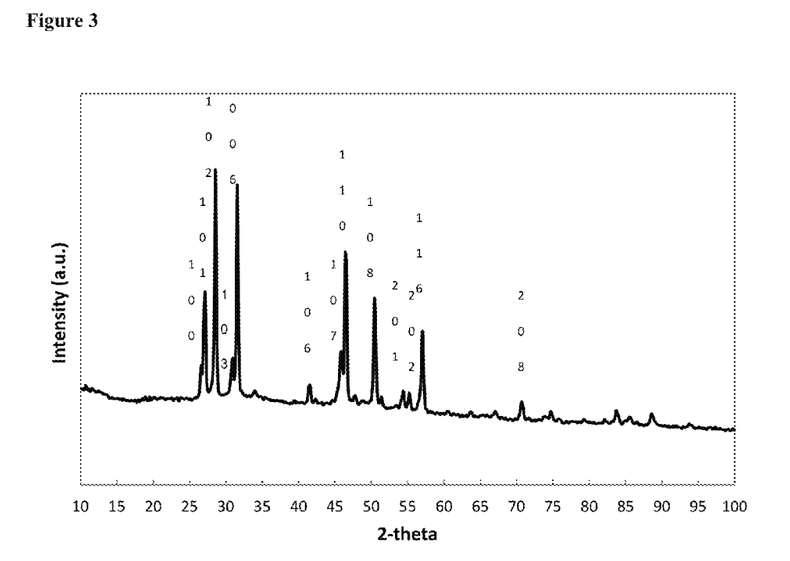
FIG. 3 is an XRD pattern for hexagonal phase CuSe capped with 1-octane selenol, as synthesised in Example 2.
Figure 4:
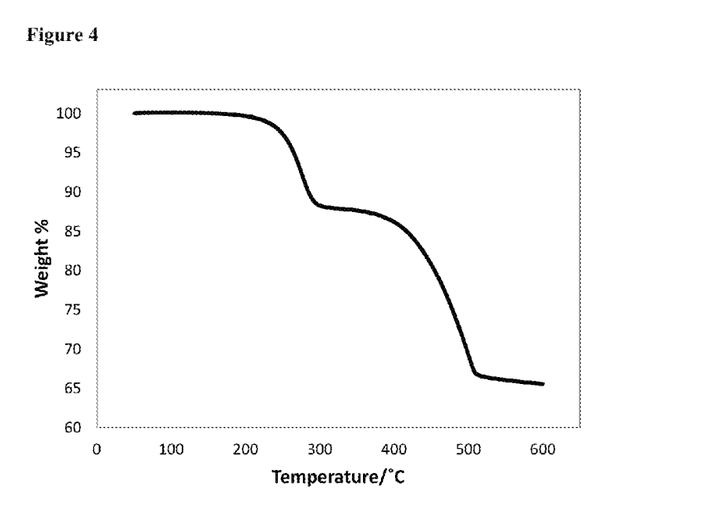
FIG. 4 is a TGA plot for hexagonal phase CuSe, as synthesised in Example 2, showing two steps: the first is likely to be loss of the capping ligand (theoretically approximately 14%), while the second may be selenium loss, as suggested by the inductively coupled plasma optical emission spectroscopy (ICP-OES) elemental analysis at 600° C.
Figure 5:
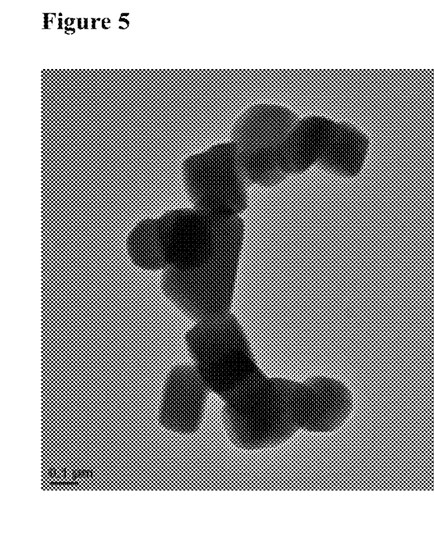
FIG. 5 is a transmission electron microscopy (TEM) image for hexagonal phase CuSe, as synthesised in Example 2, showing particles with a plate-like morphology and diameters in the region of 100-200 nm.

Synthesis of Hexagonal Phase Octane Selenol-Capped CuSe Nanoparticles with the Klockmannite Crystal Structure 3.88 g of $Cu(acac)_2$ (acac=acetylacetonate; 0.0148 mol), 2.02 g of Se powder (0.0256 mol) and 27 mL of 1-octadecene were degassed for 30 minutes at 100° C., then 10 minutes at 140° C., before cooling to room temperature under nitrogen flow. 16 mL of 1-octane selenol (0.0897 mol), was injected into the flask, then the mixture was heated to 160° C., then held for 2 hours, before annealing at 120° C. for 4 hours, then cooling to room temperature. The solid was isolated by washing with methanol, then acetone, followed by centrifugation. The yellow/green supernatant was discarded, and the fine black powder was retained as the product. Elemental analysis for the product by ICP-OES: C 6.70%; H 1.10%; Cu 40.82%; Se 50.25%. The elemental ratio corresponds to $CuSe_{0.99}$. FIG. 3 is an XRD pattern for hexagonal phase CuSe capped with 1-octane selenol, as synthesised in Example 2. FIG. 4 is a TGA plot for hexagonal phase CuSe, as synthesised in Example 2, showing two steps. The first is likely to be loss of the capping ligand (theoretically approximately 14%), while the second may be selenium loss, as suggested by the ICP-OES elemental analysis at 600° C. FIG. 5 is a transmission electron microscopy (TEM) image for hexagonal phase CuSe, as synthesised in Example 2, showing particles with a plate-like morphology and diameters in the region of 100-200 nm.

Example 3

Figure 6:
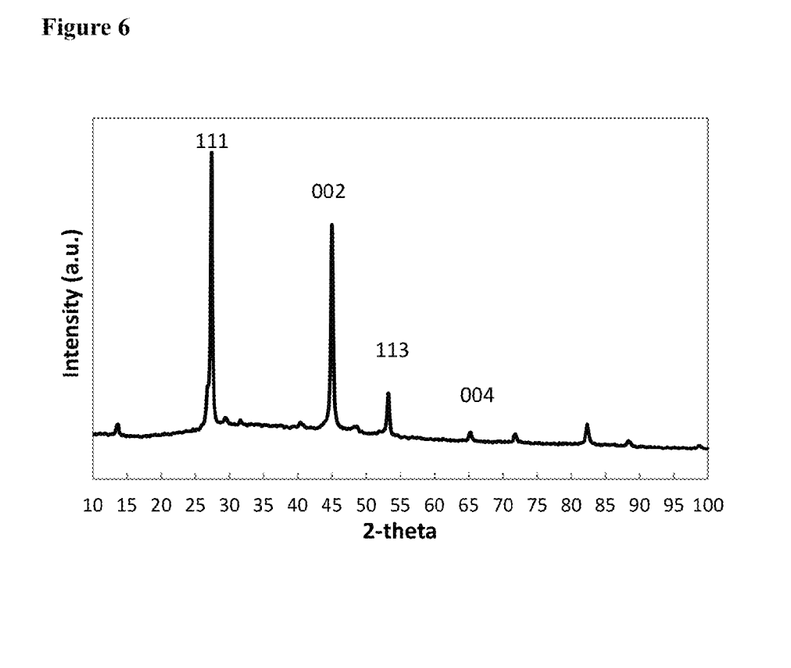
FIG. 6 is an XRD pattern for cubic phase $Cu_{2-x}Se$ capped with 1-octane selenol, as synthesised in Example 3.
Figure 7:
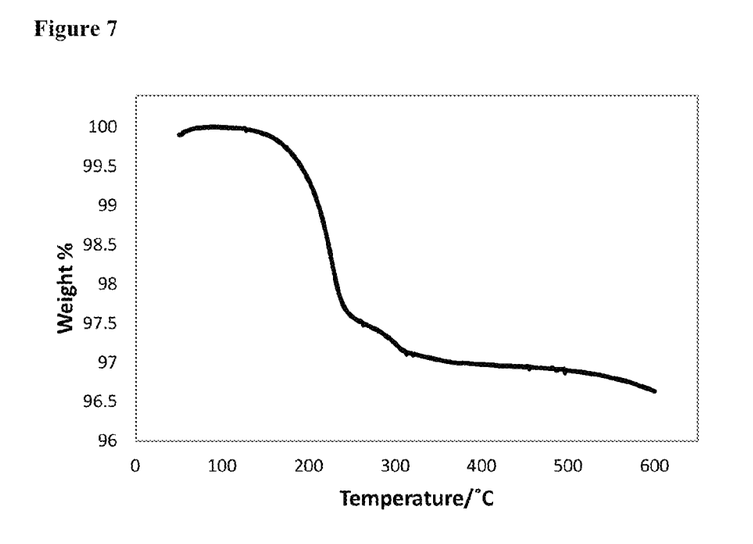
FIG. 7 is a TGA plot for cubic phase $Cu_{2-x}Se$ capped with 1-octane selenol, as synthesised in Example 3, showing an inorganic content of 97% for the organic-capped nanoparticles.

Synthesis of Cubic Phase Octane Selenol-Capped $Cu_{2-x}Se$ Nanoparticles with the Berzelianite Crystal Structure 3.88 g of $Cu(acac)_2$ (0.0148 mol), 22.5 mL of 1-octadecene and 20.5 mL of 1-octane selenol (0.1149 mol) were degassed for 30 minutes at 100° C., then 10 minutes at 140° C., before cooling to room temperature under nitrogen flow. The mixture was heated to 160° C., then held for 2 hours, before annealing at 120° C. for 4 hours, then cooling to room temperature. The solid was isolated by washing with methanol, then acetone, followed by centrifugation. The yellow/green supernatant was discarded, and the black solid was retained as the product. Elemental analysis for the as-synthesised product by ICP-OES: C 1.56%; H 0.22%; Cu 59.18%; Se 37.78%. The elemental ratio corresponds to $Cu_{1.95}Se$. Elemental analysis for the product after heating to 600° C.: C 0.03%; H 0.00%; Cu 63.40%; Se 36.49%, suggesting loss of inorganic selenium from the nanoparticles as well as the organo-selenol ligand. FIG. 6 is an XRD pattern for cubic phase $Cu_{2-x}Se$ capped with 1-octane selenol, as synthesised in Example 3. FIG. 7 is a TGA plot for cubic phase $Cu_{2-x}Se$ capped with 1-octane selenol, as synthesised in Example 3, showing an inorganic content of 97% for the organic-capped nanoparticles.

Example 4

Figure 8:
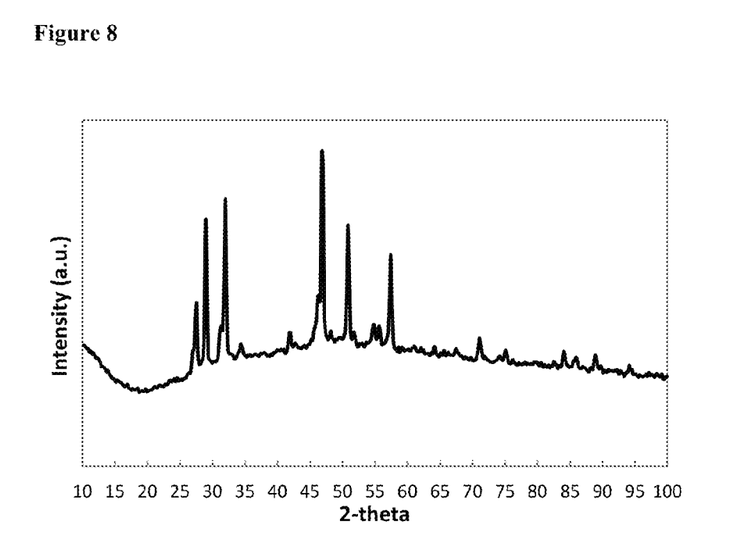
FIG. 8 is an XRD pattern for hexagonal phase CuSe capped with hexadecylamine and octane selenol, as synthesised in Example 4.

Synthesis of Hexagonal Phase Hexadecylamine and Octane Selenol-Capped CuSe with the Klockmannite Crystal Structure 1.94 g of $Cu(acac)_2$ (0.0074 mol), 1.08 g of Se powder (0.0137 mol), 7.0 g of hexadecylamine and 7 mL of 1-octadecene were degassed for 60 minutes at 100° C., before cooling to room temperature under nitrogen flow. The flask was reheated to 50° C. and 8 mL of 1-octane selenol (0.0448 mol), was injected into the flask, then the mixture was heated gradually to 160° C., then held for 2 hours, before annealing at 120° C. for 4 hours, then cooling to room temperature. The solid was isolated by washing with methanol, followed by centrifugation. The brown supernatant and a brown oil were discarded. The solid was dispersed in toluene, then washed with acetone, then centrifuged. The fine black powder was retained as the product. Elemental analysis for the product by ICP-OES: C 14.65%; H 2.31%; N 0.55%; Cu 35.97%; Se 43.05%. The elemental ratio corresponds to $CuSe_{0.96}$. FIG. 8 is an XRD pattern for hexagonal phase CuSe capped with hexadecylamine and octane selenol, as synthesised in Example 4.

Example 5

Figure 9:
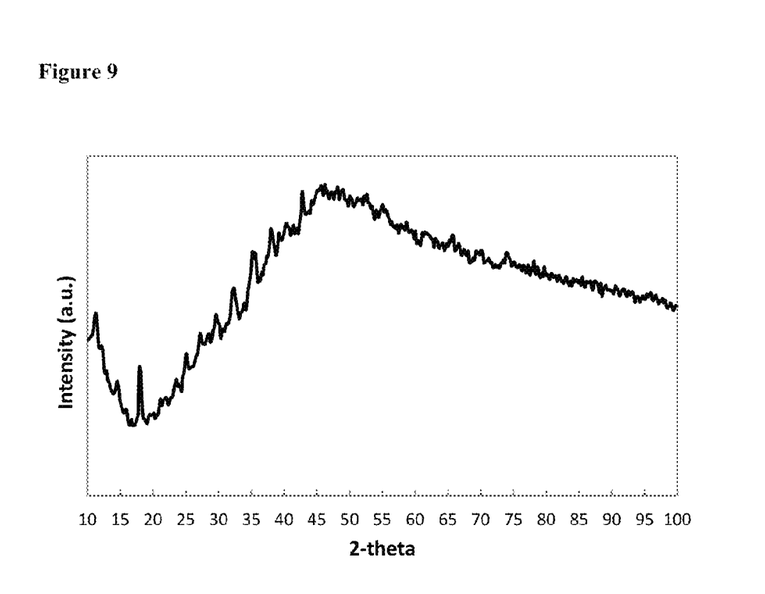
FIG. 9 is an XRD pattern for CuSe capped with oleic acid, hexadecylamine and 1-octane selenol, as synthesised in Example 5. The amorphous diffraction pattern may be indicative of broad peaks and thus small nanoparticles.
Figure 10:
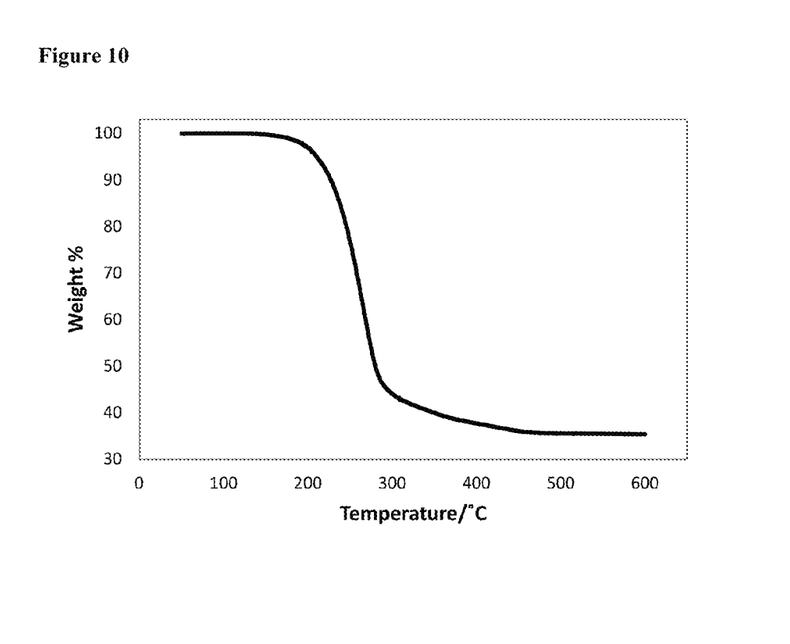
FIG. 10 is a TGA plot for oleic acid, hexadecylamine and 1-octane selenol-capped CuSe, as synthesised in Example 5, showing an inorganic content of 35% for the organic-capped nanoparticles.

Synthesis of Oleic Acid, Hexadecylamine and Octane Selenol-Capped CuSe Nanoparticles 1.94 g of $Cu(acac)_2$ (0.0074 mol), 7 mL of hexadecylamine, 7 mL of 1-octadecene and 2 mL of oleic acid were degassed for 30 minutes at 100° C. The flask was back-filled with nitrogen, then heated to 150° C., then stirred for 1½ hours, forming a brown mixture, then cooled to room temperature. 8 mL of 1-octane selenol (0.0448 mol), was injected into the flask, then the mixture was heated gradually to 140° C. 6.9 mL of Se/ODE solution (0.8 M, 0.0055 mol of Se) was injected in dropwise over 3½ minutes. The temperature was held at 140° C. for a further 5 minutes, before cooling to room temperature. The solid was isolated by washing with methanol, followed by centrifugation. The yellow supernatant and a brown oil were discarded. The solid was dispersed in toluene, then washed with acetone, then centrifuged. Dark brown solid was retained as the product. Elemental analysis for the product by ICP-OES: C 47.15%; H 7.86%; N 0.46%; Cu 17.71%; Se 21.18%. The elemental ratio corresponds to $CuSe_{0.96}$. FIG. 9 is an XRD pattern for CuSe capped with oleic acid, hexadecylamine and 1-octane selenol, as synthesised in Example 5. The amorphous diffraction pattern may be indicative of broad peaks and thus small nanoparticles. FIG. 10 is a TGA plot for oleic acid, hexadecylamine and 1-octane selenol-capped CuSe, as synthesised in Example 5, showing an inorganic content of 35% for the organic-capped nanoparticles.

Example 6

Preparation of a $CuInSe_2$ Thin Film from $CuInSe_2$ and CuSe Nanoparticles

Figure 11:
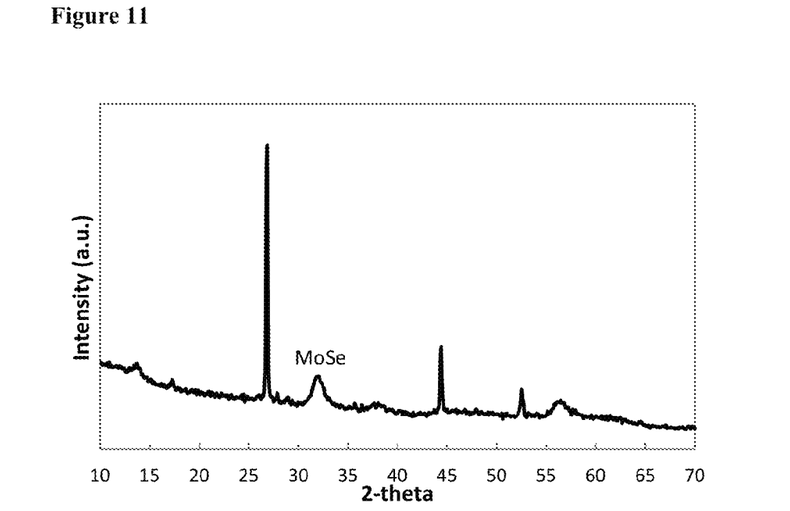
FIG. 11 is an XRD pattern for a $CuInSe_2$ film grown by annealing a $CuInSe_2$/CuSe nanoparticle precursor film in a selenium atmosphere on a molybdenum coated glass substrate. The narrow peak width is indicative of large crystals.
Figure 12:
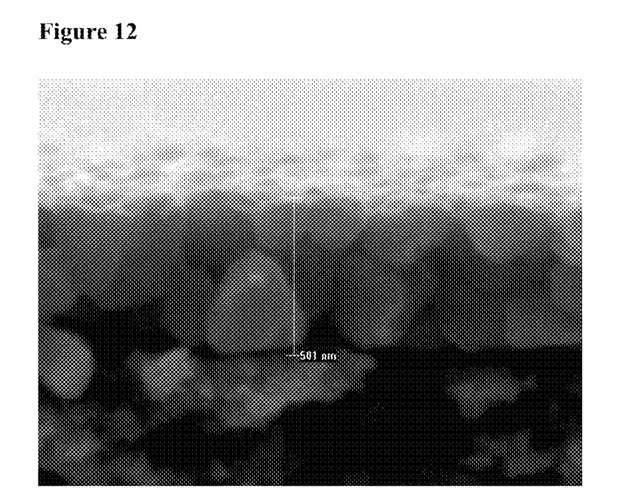
FIG. 12 is a scanning electron microscopy (SEM) image of a thin film of $CuInSe_2$ with large grains crystals grown by annealing a $CuInSe_2$/CuSe nanoparticle precursor film in a selenium atmosphere.

A $CuInSe_2$ film was grown by annealing a $CuInSe_2$/CuSe nanoparticle precursor film in a selenium atmosphere on a molybdenum-coated glass substrate. The CuSe nanoparticles were incorporated to promote crystal growth in the $CuInSe_2$ layer. FIG. 11 is an XRD pattern of the film. The narrow peak width is indicative of large crystals. FIG. 12 is a scanning electron microscopy (SEM) image of the film obtained, showing large grain crystals grown upon annealing the $CuInSe_2$/CuSe nanoparticle precursor film in a selenium atmosphere.

The above description and examples are intended to be illustrative, and not restrictive. For example, the above-described embodiments may be used in combination with each other. Many other embodiments will be apparent to those of skill in the art upon reviewing the above description.

The invention claimed is:

1. A population of nanoparticles, comprising:
copper selenide nanoparticles represented by the formula $Cu_{(2-x)}Se$, where $0 \leq x < 2$ and wherein the surface of the nanoparticles are bound to ligands via a selenium-carbon bond.

2. The population of claim 1, wherein in ligands comprise straight chain alkyl groups.

3. The population of claim 1, wherein the ligands comprise C6-C10 alkyl groups.

4. The population of claim 1, wherein the population is substantially monodisperse.

5. The population of claim 1, wherein the standard deviation of the nanoparticle diameters in the population is less than about 10% of the average of the diameters.

6. A composition comprising:
a population of copper selenide nanoparticles dispersed in a solvent, wherein the nanoparticles are represented by the formula $Cu_{(2-x)}Se$, where $0 \leq x < 2$ and wherein the surface of the nanoparticles are bound to ligands via a selenium-carbon bond.

7. The composition of claim 6, further comprising free selenol molecules dissolved in the solvent.

8. The composition of claim 6, further comprising nanoparticles having the formula $CuIn_{1-a}Ga_aSe_{2-b}S_b$ where a is greater than or equal to 0 and less than or equal to 1 and b is greater than or equal to 0 and less than 2.

9. The composition of claim 6, wherein the solvent is an aromatic hydrocarbon.

10. A composition comprising:
a film disposed on a substrate, wherein the film comprises nanoparticles represented by the formula $Cu_{(2-x)}Se$, where $0 \leq x < 2$ and wherein the surface of the nanoparticles are bound to ligands via a selenium-carbon bond.

11. The composition of claim 10, wherein the film further comprises nanoparticles having the formula $CuIn_{1-a}Ga_aSe_{2-b}S_b$ where a is greater than or equal to 0 and less than or equal to 1 and b is greater than or equal to 0 and less than 2.

12. A process for producing copper selenide nanoparticles represented by the formula $Cu_{(2-x)}Se$ where $0 \leq x < 2$, the process comprising effecting conversion of a nanoparticle precursor composition comprising reacting a copper precursor and a selenium precursor in the presence of a selenol compound.

13. The process of to claim 12, wherein the selenol compound is 1-octane selenol or 1-dodecane selenol.

14. The process of claim 12, wherein the copper precursor is a copper acetate.

15. The process of claim 12, wherein the selenium precursor is the selenol compound.

16. The process of claim 12, wherein the selenium precursor is elemental selenium.

17. A process of forming a semiconductor film, the process comprising:
   applying a formulation to a substrate to form a layer, the formulation comprising a population of copper selenide nanoparticles dispersed in a solvent, wherein the nanoparticles are represented by the formula $Cu_{(2-x)}Se$, where $0 \leq x < 2$ and wherein the surface of the nanoparticles are bound to ligands via a selenium-carbon bond.

18. A process according to claim 17, further comprising applying CIGS nanoparticles to the substrate, the CIGS nanoparticles having the formula $CuIn_{1-a}Ga_aSe_{2-b}S_b$ where a is greater than or equal to 0 and less than or equal to 1 and b is greater than or equal to 0 and less than 2.

19. A process according to claim 17, further comprising annealing the layer.

* * * * *